United States Patent
Prantl et al.

(10) Patent No.: US 7,898,052 B2
(45) Date of Patent: Mar. 1, 2011

(54) COMPONENT WITH A SEMICONDUCTOR JUNCTION AND METHOD FOR THE PRODUCTION THEREOF

(75) Inventors: Anton Prantl, Österreich (AT); Franz Schrank, Österreich (AT); Rainer Stowasser, Österreich (AT)

(73) Assignee: Austriamicrosystems AG, Osterreich (AU)

( * ) Notice: Subject to any disclaimer, the term of this patent is extended or adjusted under 35 U.S.C. 154(b) by 15 days.

(21) Appl. No.: 11/793,361

(22) PCT Filed: Nov. 28, 2005

(86) PCT No.: PCT/EP2005/012698
§ 371 (c)(1),
(2), (4) Date: Feb. 1, 2008

(87) PCT Pub. No.: WO2006/066690
PCT Pub. Date: Jun. 29, 2006

(65) Prior Publication Data
US 2008/0211051 A1    Sep. 4, 2008

(30) Foreign Application Priority Data
Dec. 15, 2004   (DE) ................. 10 2004 060 365

(51) Int. Cl.
*H01L 27/146* (2006.01)
*H01L 21/763* (2006.01)

(52) U.S. Cl. ............ 257/446; 257/291; 257/292; 257/443; 257/444; 257/447; 257/461; 257/E27.133; 257/E31.053; 257/E21.564; 438/80

(58) Field of Classification Search .............. 257/258, 257/290–293, 443–444, 440, 446–448, 458, 257/460–464, E27.125, E27.133, E31.053, 257/E21.564; 438/80
See application file for complete search history.

(56) References Cited

U.S. PATENT DOCUMENTS

| | | | |
|---|---|---|---|
| 5,360,987 A | 11/1994 | Shibib | 257/446 |
| 5,886,374 A * | 3/1999 | Sakamoto et al. | 257/292 |
| 5,994,751 A | 11/1999 | Oppermann | 257/446 |
| 6,188,093 B1 * | 2/2001 | Isogai et al. | 257/230 |
| 6,258,636 B1 | 7/2001 | Johnson et al. | 438/149 |

(Continued)

FOREIGN PATENT DOCUMENTS

DE    19838430    3/2000

(Continued)

OTHER PUBLICATIONS

DE10306295 (machine translation).*

(Continued)

*Primary Examiner*—Jerome Jackson, Jr.
*Assistant Examiner*—Yu Chen
(74) *Attorney, Agent, or Firm*—Nexsen Pruet, LLC; Joseph T. Guy

(57) ABSTRACT

A component comprising a semiconductor junction (HU) is proposed which is formed from crystalline doped semiconductor layers. A semiconductor circuit (IC) is formed on the surface of the component, and a diode is formed internally and directly below the circuit. Integrated circuit and diode are connected to one another and formed and integrated diode component, in particular a photodiode array.

13 Claims, 5 Drawing Sheets

U.S. PATENT DOCUMENTS

| | | | |
|---|---|---|---|
| 6,380,037 B1 | 4/2002 | Osanai | 438/294 |
| 6,465,846 B1 | 10/2002 | Osanai | 257/347 |
| 6,538,299 B1 | 3/2003 | Kwark et al. | 257/458 |
| 6,930,336 B1 * | 8/2005 | Merrill | 257/292 |
| 2002/0020846 A1 | 2/2002 | Pi et al. | 257/88 |
| 2002/0081766 A1 | 6/2002 | Iriguchi | 438/69 |
| 2003/0222204 A1 * | 12/2003 | Gidon et al. | 250/214.1 |

FOREIGN PATENT DOCUMENTS

| | | |
|---|---|---|
| DE | 19838373 | 1/2002 |
| DE | 103 06 295 A1 | 9/2004 |
| DE | 10306295 A1 * | 9/2004 |
| EP | 1 569 275 A1 | 8/2005 |
| WO | WO 2004/008537 A2 | 1/2004 |
| WO | 2004/054001 | 6/2004 |
| WO | WO 2004/047178 | 6/2004 |
| WO | WO 2004/057675 | 7/2004 |

OTHER PUBLICATIONS

XP-002375073, M.K. Emsley et al., "Realization of High-Efficiency 10 GHz Bandwidth Silicon Photodetector Arrays for Fully Integrated Optical Data Communicatin Interfaces", pp. 47-50.

* cited by examiner

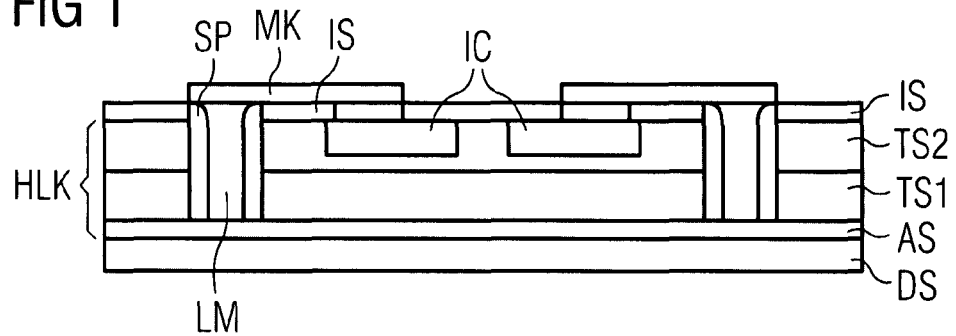
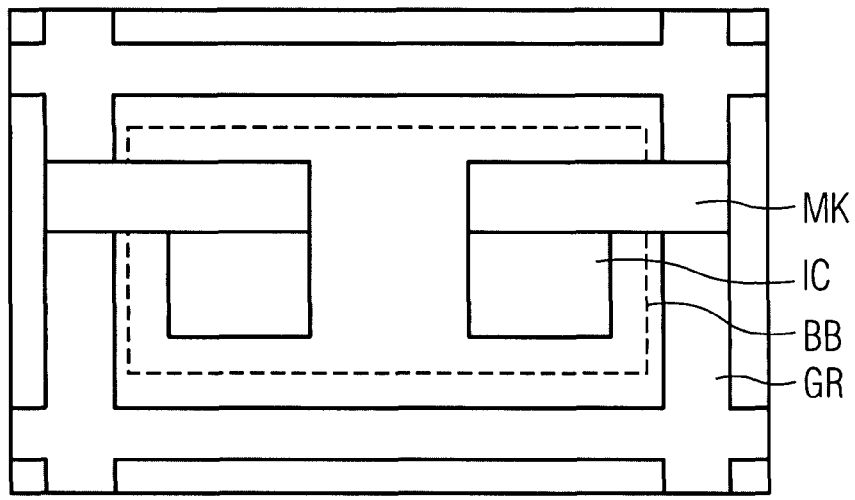
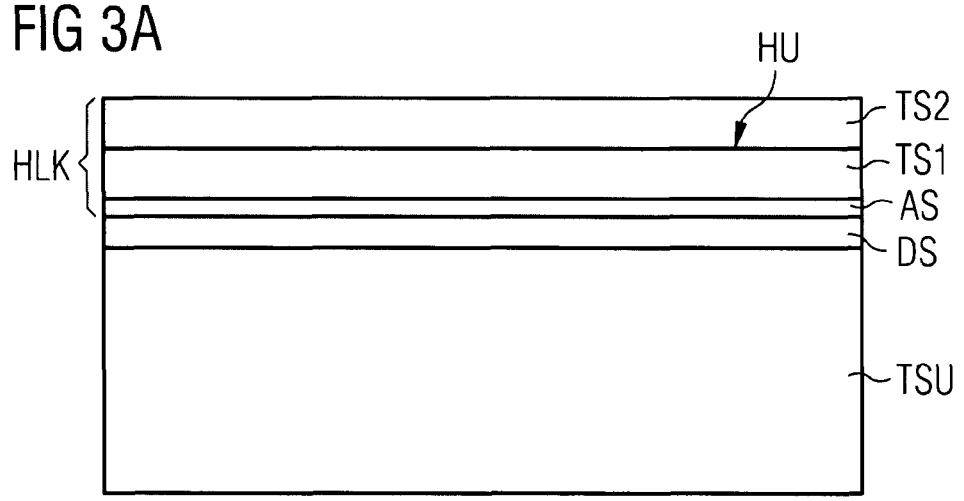

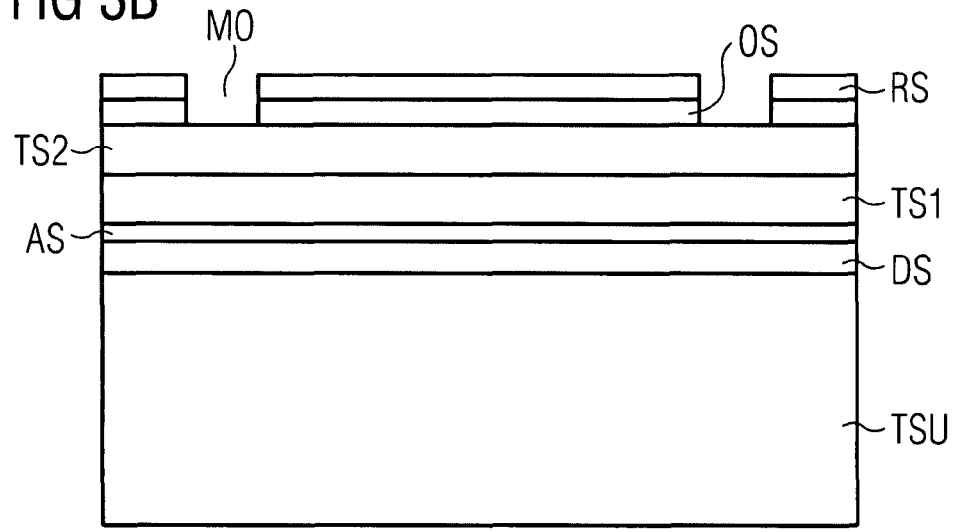
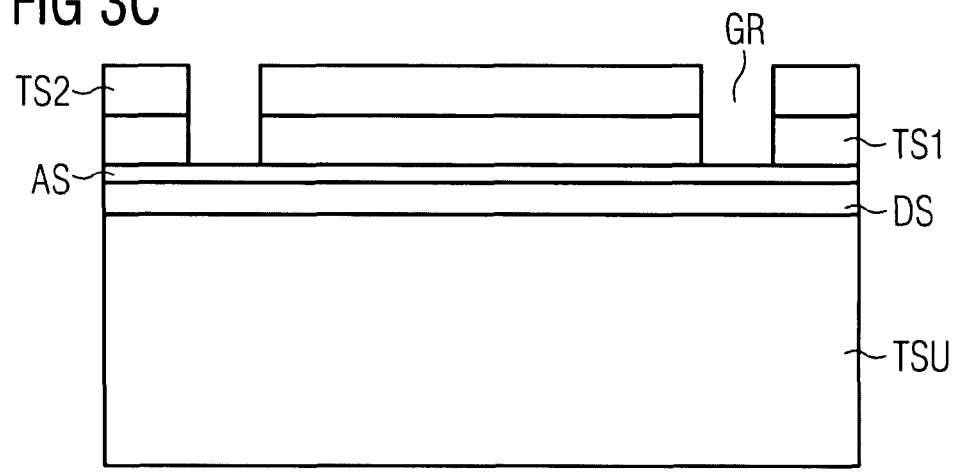
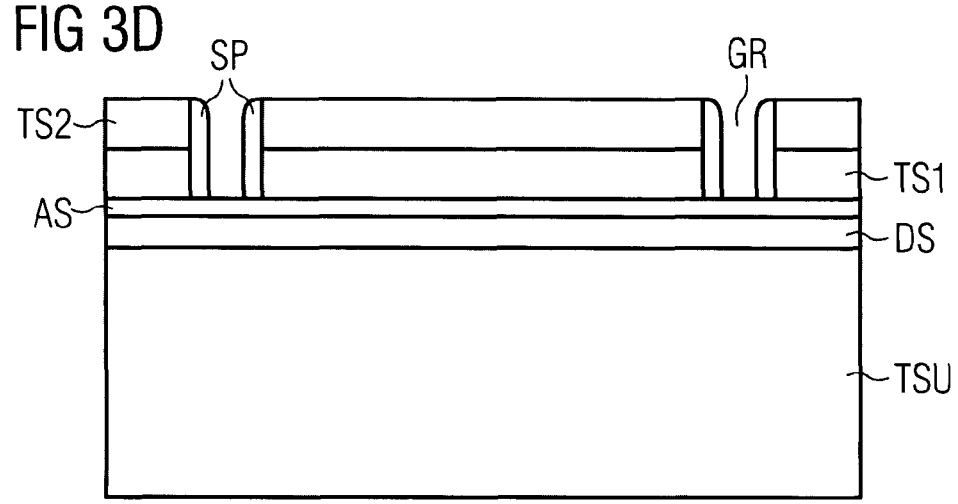

COMPONENT WITH A SEMICONDUCTOR JUNCTION AND METHOD FOR THE PRODUCTION THEREOF

Substrates comprising SOI semiconductor layers (silicon on isolator) are known in which a monocrystalline semiconductor layer is arranged above a dielectric layer. The dielectric layer is usually the covering layer of a carrier substrate. CMOS circuits or else MEMS components (micro electro mechanical system) can be realized in such substrates.

Known substrates comprising SOI layers are for example semiconductor wafers having a relatively thin monocrystalline layer above an oxide layer. Substrates having relatively thin SOI layers having a thickness of, for example, from 100 Å afford the possibility of leading patternings as far as the dielectric layer and thus producing for example deeply extending STI isolations (shallow trench isolation) with which adjacent components can be reliably and completely isolated from one another. Therefore, on substrates comprising SOI layers parasitic side effects can be avoided significantly better since all bulk effects can be minimized or eliminated by the buried dielectric layer. These components can have high operating speeds with a low current consumption. In general, with substrates comprising SOT layers it is possible to realize any desired "thin-film components" on mechanically stable carrier substrates. MEMS components require substrates having higher layer thicknesses.

It is known to realize semiconductor components in SOI layers by patterning the surface and in particular by producing doped regions in the surface.

In order to produce substrates comprising SOI layers it is known, for example, to connect two wafers, at least one of which has an oxide layer on its surface, to one another by means of standard water bonding methods. It is also possible to produce the dielectric layer by implanting oxygen into a desired depth of at most approximately 1 µm. In the case of wafer-bonded substrates it is generally necessary to thin the semiconductor layer that is intended to become the SOI layer to the desired layer thickness after wafer bonding.

One type of semiconductor components is diodes, and in particular photodiodes, which require a relatively high layer thickness for the semiconductor in order that the space charge zone within the semiconductor is undisturbed. It is known to arrange photodiodes in arrays in order thus to carry out image recognitions, by way of example. In this case, the electrical leads for driving the individual diodes in the array are generally arranged on the surface of the semiconductor. Furthermore, additional integrated semiconductor circuits are required here in order to process and if appropriate evaluate the signals supplied by the photodiode array. In this case, the semiconductor circuits can be produced in the same substrate alongside the array and have to be connected to the individual diodes of the array via an interconnection. From and exceeding a specific array size, the interconnection complexity rises to such a great extent that it can no longer be implemented in a worthwhile manner.

It is also possible to realize the integrated semiconductor circuits on a separate substrate and to connect them to the photodiode array externally. A considerable interconnection complexity arises in this case as well. What is more, both in the case of separate components and in the case of embodiments integrated on a substrate, the achievable density of individual diodes on the available semiconductor surface is limited. In addition, separately realized components require a higher outlay for packaging.

It is an object of the invention, therefore, to specify an integrated semiconductor component comprising at least two different component types which avoids the disadvantages mentioned.

This object is achieved according to the invention by means of a component comprising a semiconductor junction with the features of claim 1. Advantageous configurations of the invention and also a method for producing the component can be gathered from further claims.

The invention proposes providing two differently doped partial layers of sufficient thickness in a crystalline semiconductor body, between which partial layers a semiconductor junction is formed or, given appropriate interconnection, a space charge zone that is large enough for the application as photodiode can form. Semiconductor junction and space charge zone are utilized by a diode formed in the semiconductor body. By contrast, a semiconductor circuit is realized in a surface of the semiconductor body, in particular at a top side thereof, said semiconductor circuit being electrically connected to the diode. Diode and semiconductor circuit are arranged directly one above another in the layer construction of the semiconductor body.

The component according to the invention utilizes the basic area of the semiconductor circuit or the semiconductor volume below the semiconductor circuit in order to form a diode there around the deeply situated semiconductor junction. This enables these two component types to be integrated vertically within a common semiconductor body in a manner not known heretofore. This has the further advantage that the interconnection of individual diode and semiconductor circuit arranged above the latter necessitates only short electrical connections which can reduce the series resistance of diode and circuit and can increase the speed of the component.

Preferably, the component is formed in a substrate comprising an SOI layer in which a crystalline semiconductor layer is arranged above a dielectric layer. The substrate comprising the SOI layer has the advantage that it is constructed layer by layer during production. The production enables virtually any desired layer thicknesses to be set, such that the different partial layers can also be realized with a suitable layer thickness in this way. Suitable total layer thicknesses for diodes lie within the range of between 1 and 500 µm, by way of example. In the case of photodiodes, the thickness of the space charge zone is dependent on the desired wavelength range and the required reaction speed and may be between less than 1 µm and a few hundred µm. The semiconductor layers, too, should then have this thickness. It generally holds true that the layer thicknesses of the semiconductor layers required for the diode function and specifically for the construction of the space charge zone are chosen to be as thin as possible without jeopardizing the mechanical stability of the overall component.

The SOI construction furthermore has the advantage that, with the dielectric layer, an etching stop layer is available which enables a patterning from the top side as far as said dielectric layer without this necessitating a complicated method control.

In one configuration of the invention, the diode is a photodiode, for the light incidence side of which the underside of the semiconductor body or the dielectric layer arranged there can be utilized. For this purpose, the dielectric layer is transparent, formed in a corresponding optical quality and made relatively thin. In the case of this combination of photodiode and semiconductor circuit, the previous underside of the component becomes the top side after later interconnection of the component by mounting onto e.g. a printed circuit board, which top side should not be shaded from the light in the circuit environment. What is appropriate for such a face down arrangement is the mounting of the component according to the invention using flip-chip technology, in which solderable contacts are provided on the (original) top side of the component and can be used finally to mount the component onto a printed circuit board or any other carrier substrate. This mounting technique has the advantage that structures arranged on the original top side of the component are embedded between semiconductor body and printed circuit board or carrier substrate and thus mechanically protected. With the aid of this flip-chip arrangement it is possible to realize cost-effective housings and encapsulations which nevertheless ensure a reliable and simple-to-produce protection against mechanical and chemical environmental influences. A further advantage afforded by the flip-chip arrangement is that it is thereby possible for a diode array of approximately any desired size to be contact-connected without relatively high complexity in one step, without this requiring connections for the individual diodes to be led out of the array in a complicated manner on the surface of the semiconductor.

In one advantageous configuration, the component has a multilayer construction, in which there is arranged above a relatively thin dielectric layer a likewise thin highly doped connection layer. Said connection layer may simultaneously constitute one of the two partial layers required for the semiconductor junction or be an additional layer. The electrical connections of the diode are then realized by trenches that are led from the top side of the semiconductor as far as said connection layer and are subsequently filled with a conductive material.

This construction has the advantage that a sufficient surface conductivity is provided by the highly doped connection layer, such that said connection layer can then be subjected to point contact-making. The trenches can be produced in a simple manner from the top side of the semiconductor body, in which case the dielectric layer may serve as an etching stop layer. However, it is also possible to lead the trenches only as far as the connection layer and to stop the etching method in a timely manner. In the case of this arrangement, the rear side of the component, that is to say the dielectric layer, remains intact during the production method. It can be produced with high optical quality and remains unchanged in this regard with such quality on the component.

All of the contacts can be led to the top side of the semiconductor body and be connected up further there via soldering contacts with flip-chip capability. While the highly doped connection layer constitutes the bottom electrode of the diode, the top electrode is formed, in a manner known per se, by a suitable metallic contact arranged on the top side of the semiconductor body. The interconnection of the diodes with the semiconductor circuit can also be effected via said metallic contact.

In a further configuration of the invention, a relatively large number of diodes together with the associated semiconductor circuits connected to them are realized in the semiconductor body, such that the component is formed as a photodiode array with integrated circuit. Whereas hitherto exclusively separate production of photodiode array and associated semiconductor circuit has been required for a photodiode array of known design, it now becomes possible for the first time to combine an even large-area array without impairing the light incidence area with a semiconductor circuit and even to integrate the latter into the semiconductor substrate. This means that, on the one hand, a maximum light incidence area of the photodiode array is maintained and, on the other hand, no additional area alongside the photodiode array is required for the semiconductor circuit.

Suitable separation of the individual diodes in the diode array can be effected by the trenches arranged in a pattern such that a checkered division of the individual diode elements in the component is obtained. The trenches can be electrically insulated at the inner side and thus bring about electrical isolation at least in the region of the second partial layer of the semiconductor body. The highly doped connection layer forming the bottommost partial layer of the semiconductor body can be used as a common electrode for all the individual diodes of the photodiode array.

One possibility for insulating exclusively the trench inner walls is realized by a spacer technique. For this purpose, a dielectric layer is deposited surface-conformally and is subsequently etched back anisotropically. The etching is carried out as far as a depth corresponding to the thickness of the dielectric layer. The surface-conformal layer thicker at the inner side of the trenches relative to the anisotropic etching remains as spacer at the inner side during this etching.

During the layer production of the dielectric layer it is also possible to set the layer coverage in the trench such that a significantly smaller layer thickness is obtained for the dielectric layer at the bottom of the trenches than at the upper opening. In an etching step not conducted a hundred percent anisotropically, in this way the dielectric layer can be removed during the spacer etching in the lower region of the trenches and a contact with the connection layer can be produced there. In this way, the electrically conductive material in the trenches is insulated only from the second, upper partial layer, but not from the connection layer and optionally neither from parts of the first partial layer. In this way it is not necessary to conduct the etching process for producing the trenches such that it stops before or in the connection layer. Rather, in this case, too, it is possible to use the dielectric layer below the connection layer as an etching stop layer.

The trenches are filled with an electrically conductive material, and in particular with doped polysilicon. In this case, the conductivity type of the polysilicon corresponds to that of the connection layer or of the first partial layer in order not to generate any blocking junctions between trench and connection layer. It is also possible, however, to fill the trenches with a metal. Tungsten, in particular, is appropriate for this purpose, specific deposition processes within holes and trenches being known for tungsten.

A metal-filled trench is electrically insulated from the second partial layer in any case. A polysilicon-filled trench does not necessarily need an insulation layer, but rather can also be insulated from the second partial layer by means of a reverse-biased semiconductor junction.

This is achieved if the doping of the poysilicon is of the same conductivity type as the doping of the first partial layer, such that no blocking semiconductor junction can form between the first partial layer and the doped polysilicon in the interior of the trench. In all cases the conductive material generally terminates flush with the upper edge of the semiconductor body.

Metallic contacts are provided on the top side of the component, said contacts forming the electrode of the diode, on the one hand, and the connections of the semiconductor circuit, on the other hand. The metallic contacts also produce a connection between the semiconductor circuit and the diode.

In one embodiment of the invention, the metallic contacts for the semiconductor circuit with the integrated photodiodes are formed as solderable contacts enabling flip-chip contact-connection of the component.

The invention is explained in more detail below on the basis of exemplary embodiments and the associated four figures. The figures serve for illustrating the invention and have therefore been drawn up only in schematic fashion and not in a manner true to scale. Identical or identically acting parts are designated by identical reference symbols.

FIG. 1 shows a component according to the invention in schematic cross section.

FIG. 2 shows the component in schematic plan view.

Figure 3E:
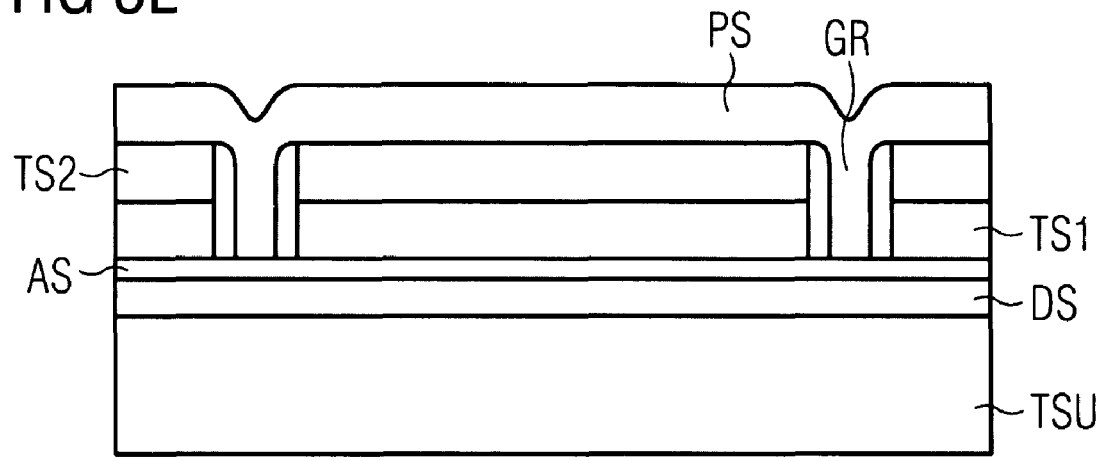
FIG. 3 shows different method stages in accordance with a first variant of the production method.

FIG. 1 shows a component according to the invention on the basis of a schematic cross section. The component has a dielectric layer DS as bottommost layer, for example comprising oxide, but alternatively also comprising some other electrically insulating but optically transparent material. A semiconductor body HLK composed of crystalline semiconductor material, in particular composed of crystalline silicon, is arranged above the dielectric layer DS. The semiconductor body is subdivided into a connection layer AS, in particular a highly doped semiconductor layer, a first partial layer TS1 having a comparatively weak doping, and a second partial layer TS2 having a likewise weak doping, which, however, is of the opposite conductivity type relative to the first partial layer. At least one semiconductor circuit IC comprising transistors of the CMOS type, for example, is formed in the surface of the semiconductor body.

A semiconductor junction HU is formed between the first and second partial layers TS1, TS2, a depletion layer or a space charge zone being formed around said semiconductor junction as a result of the diffusion of charge carriers. The first partial layer can optionally also be dispensed with, so that the semiconductor junction is then formed between the connection layer and the second partial layer. The space charge zone forms the basis of the diode formed in the semiconductor body. The first connection of the diode is ensured by means of the connection layer AS, which makes electrically conductive contact with a conductive material LM filling a trench in the semiconductor body HLK. At the surface of the semiconductor body, the conductive material is contact-connected to a metallic contact MK, which also produces the connection to the semiconductor circuit. The second connection of the diode is effected by means of a metallization (not illustrated in the figure) bearing on the top side of the second partial layer TS2. This electrode is at least partly insulated from the metallic contact MK in order to avoid a short circuit of the diode.

FIG. 2 shows a component according to the invention in a schematic plan view. In this embodiment, the trenches are embodied such that the overall component, which can comprise a plurality of diodes, experiences a checkered division by the trenches. Accordingly, the trenches are arranged along straight lines crossing one another at right angles. The metallic contacts MK make contact both with the conductive material LM in the interior of the trenches GR and with the corresponding connections of the semiconductor circuit IC. In the component region BB in which the integrated circuit is arranged, the metallic contacts MK are insulated from the surface of the semiconductor body by means of an insulating layer IS.

Outside the component region BB, the top electrode for the diode is formed (not illustrated in the figure), said top electrode being insulated from the conductive material in the trenches GR.

The production of the component is described below on the basis of an exemplary embodiment.

FIG. 3a shows in schematic cross section a semiconductor substrate that can be used as starting material for the component. It comprises a carrier substrate TSU, for example likewise a semiconductor substrate or any other mechanically stable material. There is formed above the carrier substrate TSU a dielectric layer DS, for example in the form of an oxide layer in the case of a semiconductor substrate. A semiconductor body HLK is applied above that, said semiconductor body having an SOI layer (silicon on insulator) or being produced as an SOI layer. For this purpose, firstly a first SOI layer, in the present case the connection layer AS, is applied on the carrier substrate with the dielectric layer using methods known per se by means of wafer bonding or other methods and technologies that are known for the production of SOI layers. The connection layer can be applied in already doped fashion or additionally be highly doped subsequently.

The first partial layer TS1 is then applied above said connection layer AS, for example by growth of a doped epitaxial layer. The thickness of the first and/or second partial layer is higher than that of the connection layer. The doping of the first partial layer is lower than that of the connection layer, but of the same conductivity type. The topmost layer of the semiconductor body HLK is the second partial layer TS2, which is applied above the first partial layer TS1 likewise in a manner doped by means of epitaxy. It is also possible to bond a correspondingly doped wafer onto the surface of the first partial layer TS1 and to reduce it to the desired layer thickness by grinding, by way of example. In both cases, a semiconductor junction HU can thus be formed at the boundary between the first and second partial layers. FIG. 3a shows the arrangement at this stage.

In a variant that is not illustrated, it suffices to form the semiconductor junction HU between the highly doped connection layer AS and a then oppositely and only weakly doped first (and sole) partial layer.

A mask is subsequently produced on the surface of the second partial layer TS2, for example by whole-area application of an oxide layer OS, which is subsequently patterned with the aid of a resist layer RS. FIG. 3b shows the arrangement with the mask openings MO produced in this way. With the aid of said mask, the trenches are subsequently produced in the semiconductor body by reactive ion etching. For this purpose, the resist layer RS can be stripped beforehand. FIG. 3c shows the arrangement after the etching of the trenches GR. In this case, the etching is conducted in such a way that it ends in the region of the connection layer AS, preferably at the boundary between first partial layer TS1 and the connection layer AS. As an alternative, the etching can also be carried out using a mask consisting exclusively of resist.

In the next step, the trenches GR are electrically insulated at the inner side. A spacer technique is used for this purpose, in which an auxiliary layer is applied in edge-covering fashion over the whole area and is subsequently etched back anisotropically, the spacer structures SP, which have a higher layer thickness relative to the anisotropic attack, remaining at the inner side of the trenches. This selectively accomplishes a coating of the trench inner side with the exception of the bottom with a dielectric layer, in particular with an oxide layer in the form of spacers SP. FIG. 3d shows the trenches with the spacers SP arranged therein.

Figure 3F:
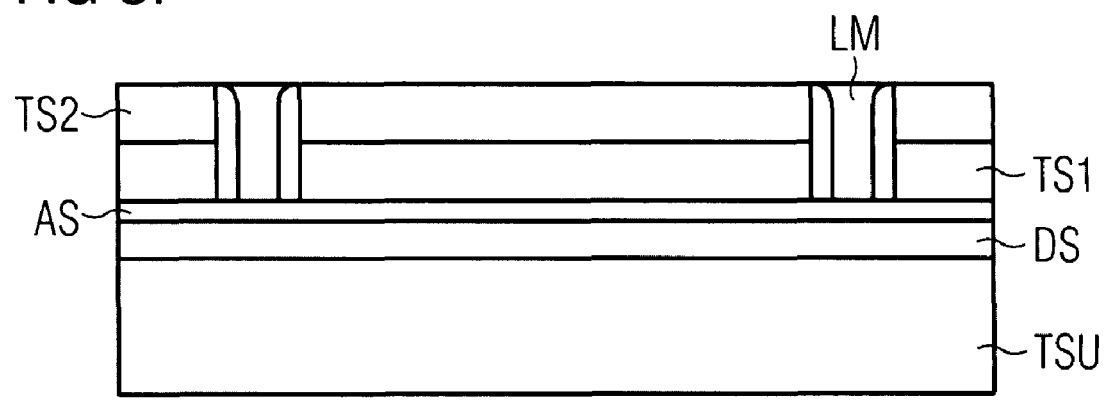

FIG. 3e: In the next step, the trenches are filled with a conductive material. For this purpose, a polysilicon layer PS can be deposited over the whole area and in edge-covering fashion. Said polysilicon layer is subsequently removed by grinding and/or etching over the surface of the semiconductor body to an extent such that a flush filling of the trenches with the doped polysilicon, that is to say with conductive material LM, remains. FIG. 3f shows the arrangement at this method stage.

Figure 3G:
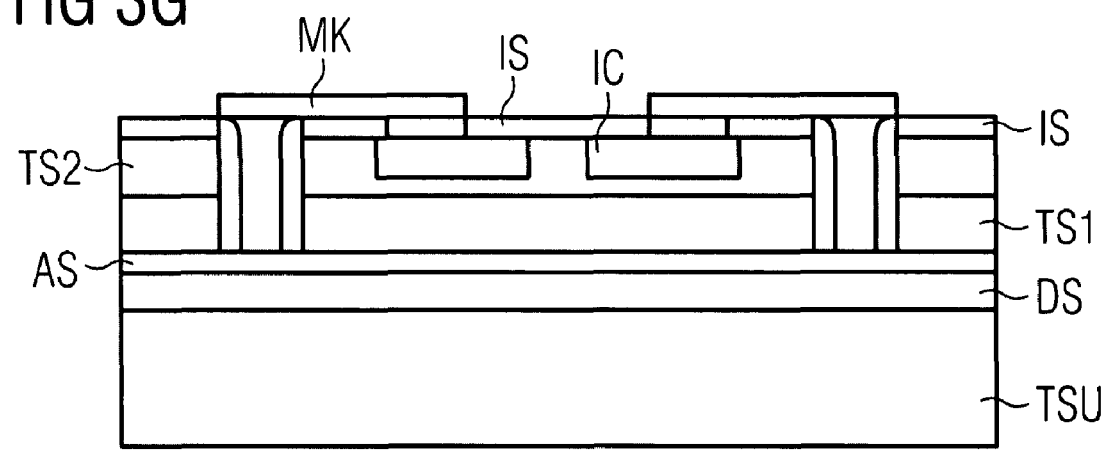

FIG. 3g: afterward, semiconductor circuits IC are produced in the second partial layer TS2 with the aid of a CMOS technique and the whole is covered with an insulation layer IS. Above the trenches GR or above the conductive material LM in the trenches and above the corresponding connections of the semiconductor circuits IC, the insulating layer IS is subsequently opened and metallic contacts MK are produced thereabove. FIG. 3g shows the arrangement at this method stage.

After the method stage illustrated in FIG. 3g, finally, the carrier substrate TSU is also removed. This is done by grinding back or etching. It is advantageous to remove a large part of the layer thickness of the carrier substrate by grinding and to etch the remainder of the carrier substrate TSU, a particularly mild uncovering of the underside of the dielectric layer DS being obtained.

In a departure from the method illustrated in FIG. 3, in a variant that is not illustrated, the trenches GR can be etched as far as the surface of the dielectric layer DS. The dielectric layer can serve as an etching stop in this case. The production of the spacer structures is dispensed with in this variant since insulation of the conductive material, in particular of the doped silicon, from the second partial layer TS2 is brought about by means of a reverse-biased blocking semiconductor junction. The conductive material LM in the trenches and the connection layer AS are doped with a dopant of the same conductivity type, thereby ensuring a good ohmic connection between the conductive material and the connection layer AS via which the bottom connection of the diode is effected.

In a further variant that is likewise not illustrated, the trenches are likewise produced as far as the surface of the dielectric layer DS, but the inner side of the trenches is not completely insulated. Rather, the spacer structures SP are only produced in the upper region of the trench opening, for example by the auxiliary layer being deposited in the trenches with a thinner layer thickness at increasing depth, such that the lower inner trench walls can be etched free during spacer etching.

In the method variants described above, firstly the trenches are produced and filled before the semiconductor circuits IC are produced. This ensures that the semiconductor circuits are not exposed to the method conditions during the production or deposition of the polysilicon layer and hence the filling of the trenches GR with conductive material. However, it is also possible to perform the trench filling with polysilicon at any other method stage which is still suitable with regard to the requisite thermal budget, for example shortly before the application of the metallic contacts.

Figure 4A:
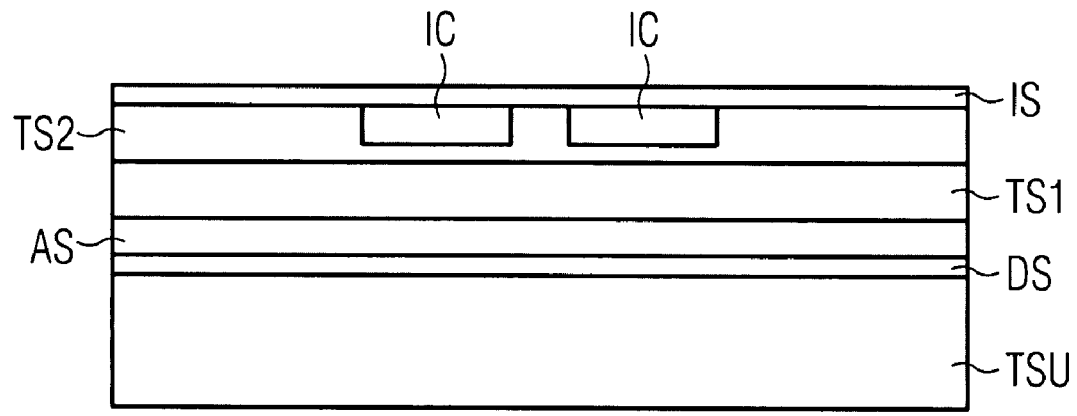
FIG. 4 shows different method stages during the production of the component in accordance with a second method variant.
Figure 4B:
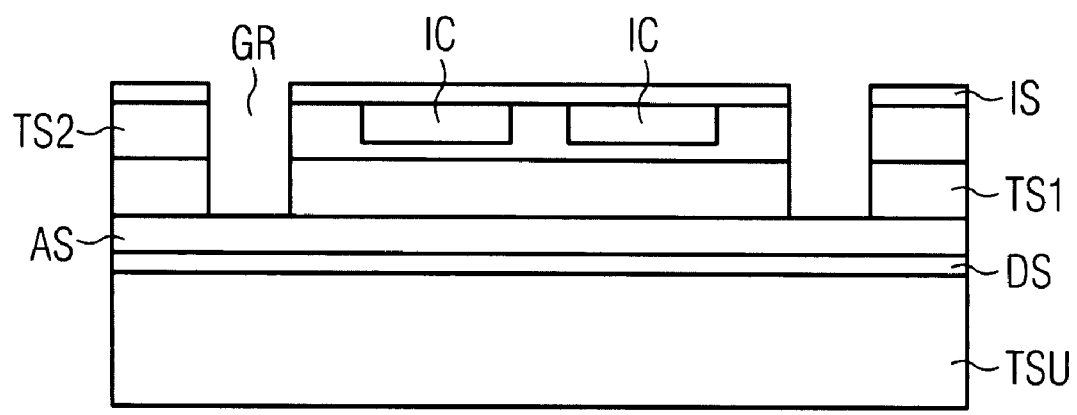

In one method variant, it is possible to vary this order further and in return to choose a mild method for trench filling. FIG. 4a shows, preceding from a substrate such as is illustrated in FIG. 3a, semiconductor circuits IC which are realized in the surface of the semiconductor body or arranged in the second partial layer TS2 thereof and which are arranged below an insulating layer IS. Only afterward are corresponding trenches GR produced by means of reactive ion etching, for example, for which purpose a thick resist mask or hard mask can be used. FIG. 4b shows the arrangement with the opened trenches GR.

Figure 4C:
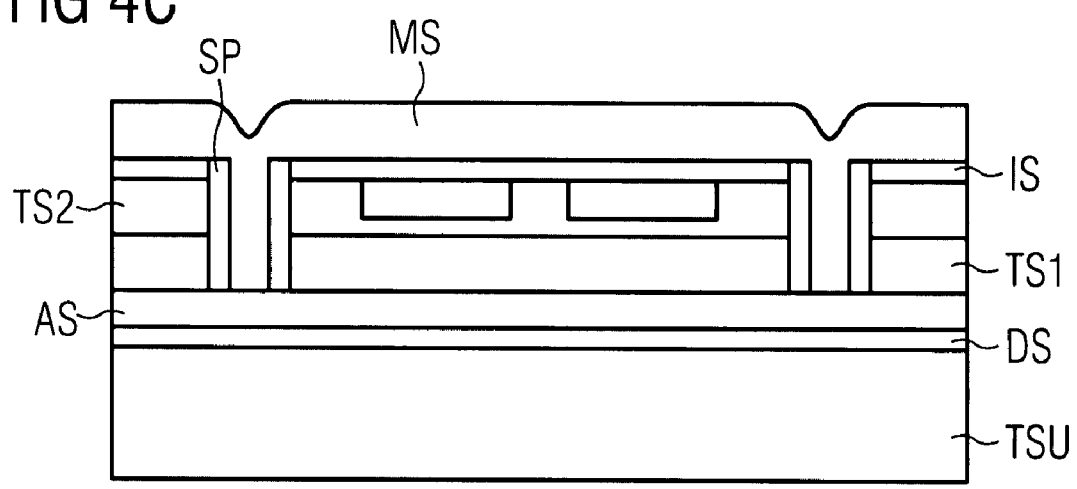

In the next step, as usual, spacers SP are produced in the interior of the trenches in order to insulate the trench walls from the trench interior. After the production of the spacers SP, a metal layer MS is produced over the whole area, which metal layer can bring about a filling of the trenches with the metal. By way of example, a tungsten layer is deposited, which is outstandingly suitable for trench and hole filling. FIG. 4c shows the arrangement with the metal layer MS.

Figure 4D:
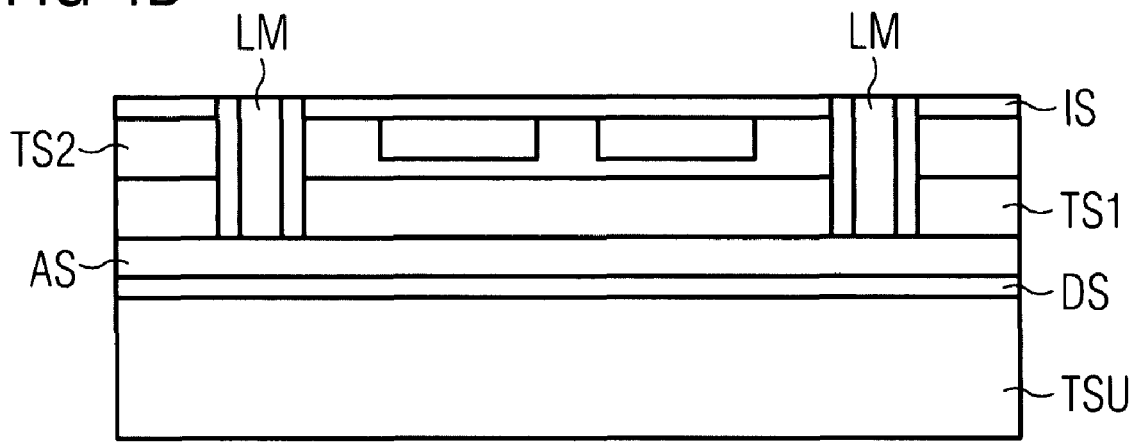
Figure 4E:
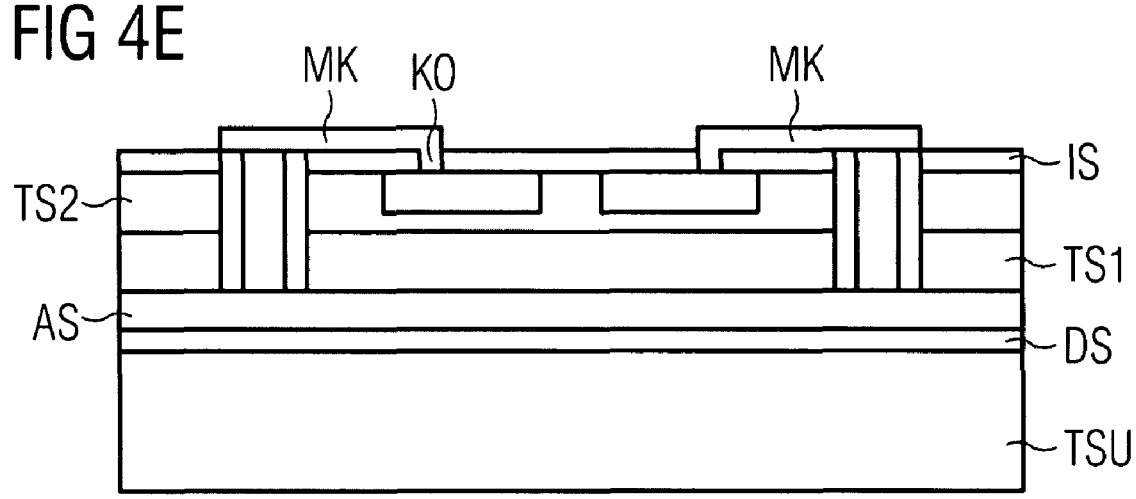

Projecting residues of the metal layer are subsequently removed to leave trenches that are filled with conductive material and terminate flush with the surface of the insulating layer IS, as is illustrated in FIG. 4d. Afterward, contact openings KO are produced in the insulation layer IS and metallic contacts MK are provided with a conventional standard metallization, for example composed of aluminum, in order to produce the metallic contacts MK for the connection of the semiconductor circuit IC and the connection thereof to the conductive material LM in the trenches and thus to the connection layer AS. FIG. 4e shows the arrangement at this method stage.

In a final method step, the carrier substrate TSU is removed. For this purpose, preferably a large part of the layer thickness of the carrier substrate TSU is removed by grinding. A remaining relatively thin layer thickness of the carrier substrate is removed by means of an etching step. This succeeds in uncovering the surface (or underside) of the dielectric layer DS without damaging the latter, the dielectric layer DS serving as an etching stop.

Figure 4F:
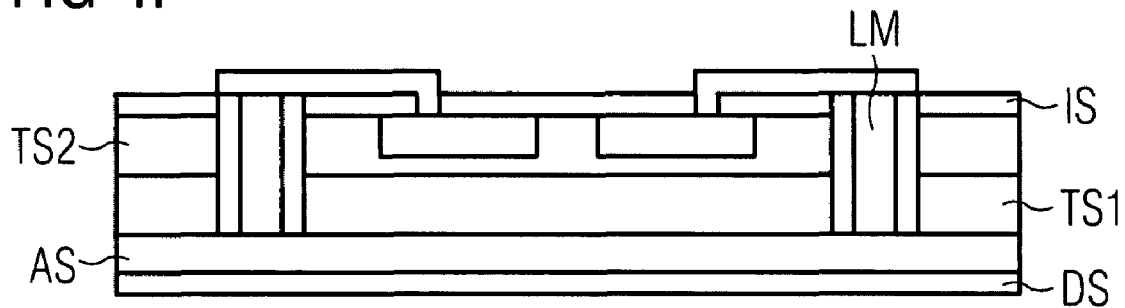

FIG. 4f shows the finished component with the uncovered dielectric layer DS, which constitutes the light incidence side of the component. The component can subsequently be soldered onto a printed circuit board by means of its metallic contacts MK, provided that they are formed in solderable fashion, or be integrated in some other circuit environment.

Although only one diode has been illustrated in each case in the exemplary embodiments, it is clear that the method can be carried out on a large-area carrier substrate TSU or with a large-area semiconductor body HLK in which a multiplicity of the components illustrated can be realized alongside one another. In this case, the metallic contacts MK can also be used for interconnecting individual single diodes or the integrated semiconductor circuits IC. However, it is also possible to produce the semiconductor circuits IC of different diodes and correspondingly also different diodes in a manner electrically insulated from one another and to perform the interconnection only by means of the soldering using a flip-chip technique on a printed circuit board.

The invention is not restricted to the exemplary embodiments illustrated in the figures. Components according to the invention can also be varied in many details. It is possible, for example, for individual diodes to be completely insulated from one another, for example by means of trenches filled with insulation material. The illustrated trenches for making contact with the connection layer can be embodied in point fashion, such that each diode is assigned a plurality of trenches or rather contact holes. The number of trenches used for contact-making is likewise arbitrary. The doping of the partial layers can also be varied, preferably the connection layer AS having an n+ doping, the first partial layer having an n− doping and the second partial layer having a p− doping. However, it is also possible to interchange the conductivity types of the first and second partial layers, correspondingly also those of the connection layer AS. It is also possible to form the diode as a pin diode with a central intrinsic layer, which may be e.g. the first partial layer TS1. It is also possible for the semiconductor body to be embodied from a different semiconductor material than silicon, for example from silicon-germanium or a compound semiconductor such as gallium arsenide, for example. The layer thicknesses of the semiconductor layers, in particular the layer thicknesses of the two partial layers TS1 and TS2, can likewise be varied. The component according to the invention is preferably a photodiode array of a size that is suitable but virtually unlimited within the SOI substrate dimensions and can be used for image recognition.

LIST OF REFERENCE SYMBOLS

DS Dielectric layer
AS Connection layer
GR Trench
LM Conductive material
MK Metallic contact
IC Semiconductor circuit
TS Partial layer
SP Spacer
BB Component region
IS Insulating layer
TSU Carrier substrate
HU Semiconductor junction
MO Mask opening
PS Polysilicon layer
MS Metal layer
KO Contact opening
HLK Semiconductor body

The invention claimed is:

1. A semiconductor device comprising:
   a crystalline semiconductor body arranged above a dielectric layer wherein said crystalline semiconductor body comprises a doped connection layer on said dielectric layer, a doped first partial layer on said connection layer and a doped second partial layer on said first partial layer wherein said second partial layer is doped with an opposite conductivity than said connection layer and said first partial layer;
   a semiconductor junction between said first partial layer and said second partial layer;
   a photodiode array comprising individual diodes formed by said semiconductor junction with said connection layer forming a common electrode for individual diodes;
   trenches arranged in said first partial layer and said second partial layer wherein said trenches reach at least as far as said connection layer and divide said photodiode array into individual diodes;
   a conductive material arranged within said trenches wherein said conductive material is electrically connected to said connection layer;
   at least one semiconductor circuit comprising CMOS type transistors formed in said semiconductor body and electrically connected to said photodiode array; and
   metallic contacts forming further electrodes of said individual diodes and forming connections between said semiconductor circuit and said individual diodes.

2. The semiconductor device of claim 1 wherein said conductive material arranged within said trenches is doped polysilicon.

3. The semiconductor device of claim 1 wherein said conductive material arranged within said trenches is a metal.

4. The semiconductor device of claim 1 wherein said conductive material arranged within said trenches is tungsten.

5. The semiconductor device of claim 1 wherein said trenches form a checkered pattern.

6. The semiconductor device of claim 1 wherein said conductive material arranged within said trenches is insulated at least from said second partial layer by a further dielectric layer.

7. A method for producing a semiconductor device comprising:
   providing a carrier substrate with a dielectric layer;
   applying a doped semiconductor connection layer on said dielectric layer;
   applying a doped semiconductor first partial layer on said connection layer;
   applying a doped semiconductor second partial layer on said first partial layer wherein said second partial layer is doped with opposite conductive than said connection layer and said first partial layer;
   forming trenches in said first partial layer and said second partial layer wherein said trenches reach at least as far as said connection layer and divide said first partial layer and said second partial layer into a checkered pattern;
   filling said trenches with an electrically conducting material contacting said connection layer;
   forming a semiconductor circuit comprising CMOS type transistors and applying metallic contacts to said second partial layer wherein said metallic contacts connect said semiconductor circuit.

8. The method of claim 7 wherein said trenches are filled with doped polysilicon.

9. The method of claim 7 wherein said trenches are filled with a metal.

10. The method of claim 7 wherein said trenches are filled with tungsten.

11. The method of claim 7 wherein said first partial layer and said second partial layer are grown as doped epitaxial layers.

12. The method of claim 7 wherein said trenches are formed by etching wherein said dielectric layer serves as an etching stop layer and said carrier substrate is removed, uncovering and underside of said dielectric layer.

13. A semiconductor device comprising:
   a dielectric layer;
   a doped connection layer on said dielectric layer;
   a doped first partial layer on said doped connection layer;
   a doped second partial layer on said doped first partial layer wherein said doped second partial layer has a conductivity opposite to said doped connection layer and said doped first partial layer;
   a semiconductor junction between said doped first partial layer and said doped second partial layer wherein said semiconductor junction forms diodes;
   trenches through said doped first first partial layer and said doped second partial layer separating said diodes into an array of individual diodes;
   a conductive material in said trenches and electrically connected to said connection layer;
   at least one semiconductor circuit comprising a CMOS transistor electrically connected to said photodiode array; and
   metallic contacts forming further electrodes of said individual diodes wherein said metallic contacts also form connections between said semiconductor circuit and said individual diodes.

* * * * *